United States Patent

Mullenbach et al.

[11] Patent Number: 5,808,876
[45] Date of Patent: Sep. 15, 1998

[54] MULTI-FUNCTION POWER DISTRIBUTION SYSTEM

[75] Inventors: Brian Scott Mullenbach; Jan Douglas Smid, both of Rochester, Minn.

[73] Assignee: International Business Machines Corporation, Armonk, N.Y.

[21] Appl. No.: 880,044

[22] Filed: Jun. 20, 1997

[51] Int. Cl.⁶ ...................................................... H05K 1/14

[52] U.S. Cl. .......................... 361/788; 361/788; 361/601; 361/622; 361/627; 361/633; 361/640; 361/679; 361/683; 361/791; 361/777; 361/785; 361/796; 361/803; 361/729; 361/733; 439/61; 439/928

[58] Field of Search ...................................... 361/788, 601, 361/622, 627, 633, 640, 679, 683, 791, 777, 785, 796, 803, 729, 733; 439/61, 928

[56] References Cited

U.S. PATENT DOCUMENTS

| 5,023,754 | 6/1991 | Aug et al. | 361/800 |
| 5,091,822 | 2/1992 | Takashima | 361/695 |
| 5,488,541 | 1/1996 | Mistry et al. | 361/788 |

*Primary Examiner*—Leo P. Picard
*Assistant Examiner*—David Foster
*Attorney, Agent, or Firm*—Andrew J. Dillon; Matthew J. Bussan

[57] ABSTRACT

A power distribution system utilizing a power distribution circuit board having a front and back side with at least one connector on each side. The connector on the front side is disposed to mate with a selected power supply and the connector on the back side is disposed to mate with a substantially identical power supply. The connector on the back side is rotated 180° so that substantially identical power supplies can be located in close proximity to each other while maintaining required conductor spacing in order to provide an improved power distribution system.

9 Claims, 3 Drawing Sheets

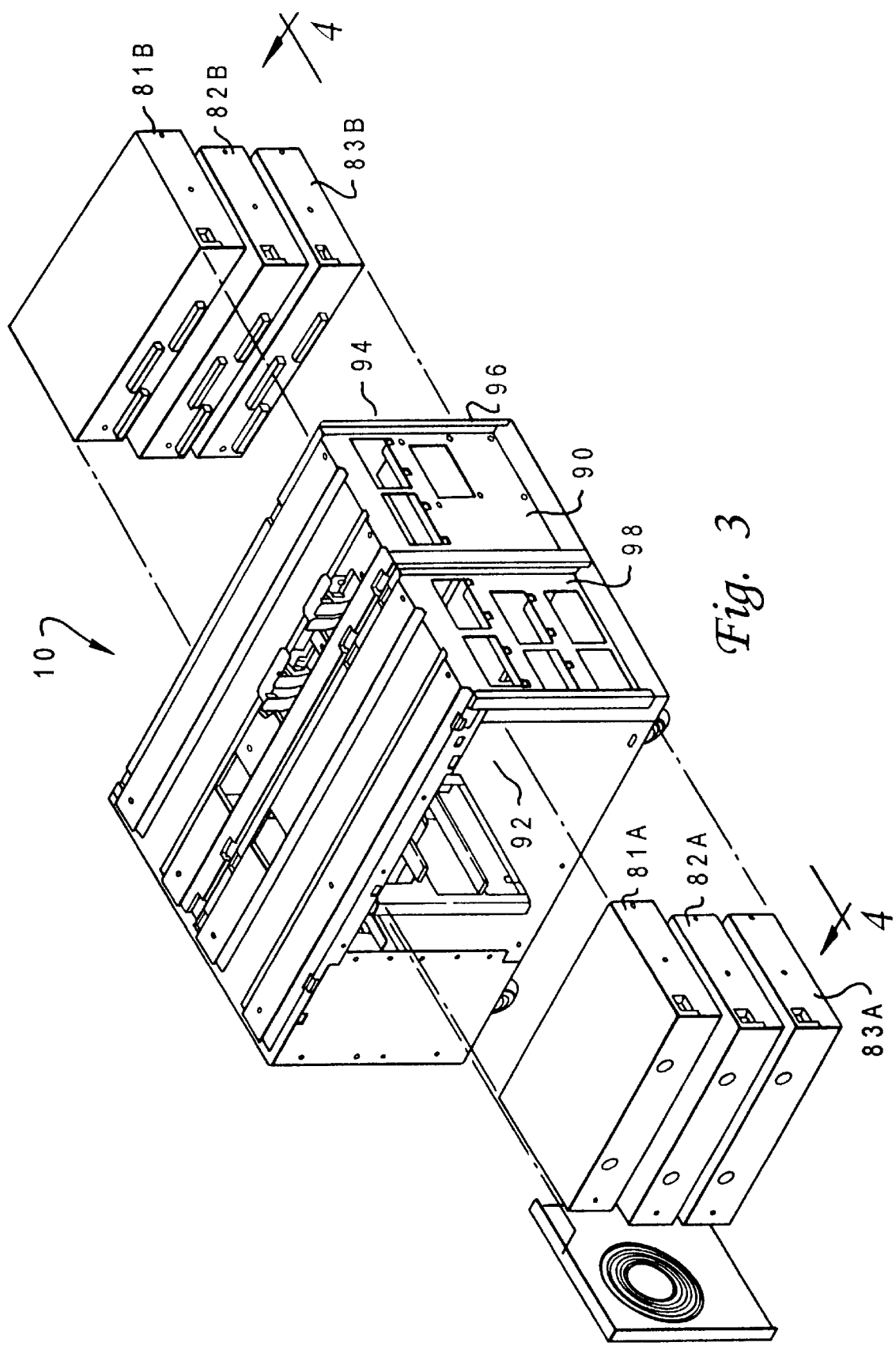

MULTI-FUNCTION POWER DISTRIBUTION SYSTEM

BACKGROUND OF THE INVENTION

1. Technical Field

The present invention relates in general to power distribution systems and in particular to data processing power distribution systems. Still more particularly, the present invention relates to a low cost, high density, multi-function power distribution system.

2. Description of the Related Art

Research and development on computer technology has continually produced smaller and more compact systems. However, packaging and interfacing of power distribution systems has not received the same amount of attention which other components of computer systems have. Power systems are a necessary and integral part of computer systems. Currently, power distribution systems utilizing multiple power supply modules do not allow usage of identical power supplies in a plurality of locations. Hence, power distribution systems require multiple drawings and part numbers for each level of assembly of each power supply. Additionally, each power supply requires cabling and placement drawings.

Current computer construction techniques for power supplies require the assembly of cables and connectors. Hand soldering and/or hand crimping is required in almost every cable assembly which interfaces power sources to circuit boards, hard drives and other peripheral devices. Cabling requirements are costly and assembly is normally done by outside contractors who specialize in wire harnesses. Utilizing outside contractors and vendors requires purchasing effort, quality control, inspection and additional part numbers. Cabling requires stripping wire ends, soldering or crimping terminals and "dressing" of cables. In certain instances wire ends must be soldered to circuit boards, which is very labor intensive. In other circumstances cable routing must be preformed utilizing strain reliefs. Finally, current designs require human labor to individually electrically and mechanically connect power supplies to a system. All of the foregoing tasks add to the assembly costs of computer systems, and in particular add to the cost of final assembly of a computer system.

Current power system designs also do not accommodate interconnection and placement of functionally and/or mechanically equivalent power supplies in close proximity to one another. Circuit board manufacturing considerations, such as tolerances related to the density of "through hole" and "trace" fabrication, prohibit the placement of power supply connectors in close proximity. Hence, lengthy power busses are required on the circuit boards or in cable runs. Problems arise when long power distribution lines are required where low voltage digital technology is used. Due to utilization of low voltages even a small voltage drop equates into a large percentage of voltage loss.

Nearly all power supplies in today's computers are "switch-mode" power supplies. Switch-mode power supplies rapidly switch, then filter to average the energy which is conducted and regulate a voltage output, utilizing feedback loops. Consequently, longer circuit distribution lines can create instability for switch-mode power supplies. Power line losses can create serious problems, particularly when power supplies are interconnected with different distribution line lengths.

Longer power distribution circuits can also radiate electronic noise which originates from switch-mode power supplies. Most switch-mode power supplies operate at a determined frequency. When the transmission line reaches a fraction of the wavelength, predetermined by the switching frequency, the power transmission line can act as an antenna. Radiating noise can interfere with low voltage logic circuits. This is particularly true when coupling occurs. Power transmission lines are present in every chip, circuit board and virtually everywhere in a computer system.

Heavier, longer traces are required in circuit board fabrication when power supplies are placed distant from one another. Distant placement also decreases reliability and increases design and fabrication costs. However, if a power distribution system is designed with too much density, costs escalate and reliability decreases. A power system design which interconnects individual power supplies as close as possible without creating additional problems is both desirable and advantageous. Hence, there is a need for a low cost, high density, reliable power system. The present invention is directed at reducing the cost and size of power systems while solving reliability problems.

SUMMARY OF THE INVENTION

It is therefore one object of the present invention to provide a compact, reliable, universal power distribution system for a data processing system.

It is another object of the present invention to provide a power distribution system which reduces cabling and labor intensive assembly by providing a double sided power distribution board with functionally equivalent connectors in the closest possible proximity.

It is yet another object of the present invention to provide short traces and minimal routing of power distribution lines to minimize voltage drops.

It is still another object of the present invention to minimize radiation noise and coupling which adversely effect sensitive circuits.

The foregoing objects are achieved as is now described. A power distribution system for use in a computer is provided utilizing a power distribution circuit board having a front and back side with at least one connector on each side. The connector on the front side is disposed to mate with a selected power supply and the connector on the back side is disposed to mate with a substantially identical power supply. The connector on the back side is rotated 180° so that substantially identical power supplies can be located in close proximity to each other while maintaining required conductor spacing in order to provide an improved power distribution system.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 3 is an exploded pictorial representation of the power distribution board with multiple power supplies for assembly into the power distribution system provided in accordance with the present invention.

DETAILED DESCRIPTION OF PREFERRED EMBODIMENT

Figure 1:
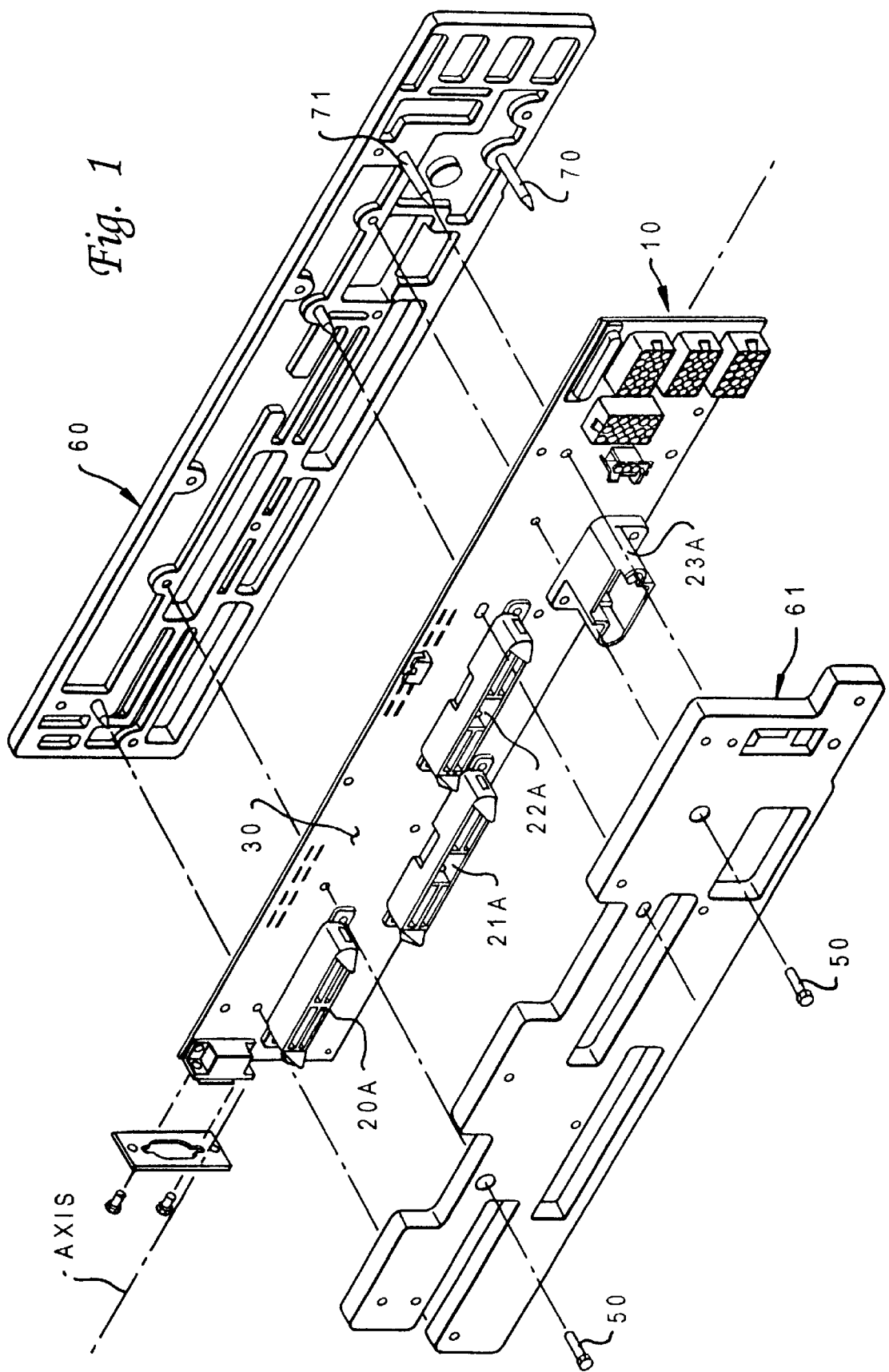
FIG. 1 is a pictorial representation of the first side of a multi-function power distribution system provided in accordance with the present invention.

With reference now to the figures and in particular with reference to FIG. 1, a power distribution system is illustrated in accordance with the present invention. FIG. 1 depicts a circuit board 10 with a plurality of connectors 20A, 21A, 22A and 23A mounted on a first side 30 of circuit board 10. Although four connectors are depicted, this is an arbitrary number and the system will function equally well with one or more connectors.

Connectors 20A, 21A, 22A and 23A are utilized to receive a power supply module (not shown in FIG. 1). Connectors 20A, 21A, 22A and 23A are of sufficient rating to accommodate the maximum voltage and current which a suitable power supply module (not shown in FIG. 1) can provide. Alternatively, fuses or circuit breakers can be provided to protect connectors 20A, 21A, 22A and 23A from damaging conditions.

Prior to operation, power supply modules having connectors which mate with connectors 20A, 21A, 22A and 23A are inserted into connectors 20A, 21A, 22A and 23A. Pins, sockets and connector housings can bind during insertion. The insertion force of the mating connectors and any possible binding can bend circuit board 10, possibly causing failure. Therefore, circuit board 10 is provided with stiffeners or backing plates 60 and 61. Backing plates 60 and 61 can be made of metal or phenolic. In a preferred embodiment, backing plates 60 and 61 are fabricated from a foam filled polycarbonate material. Backing plates 60 and 61 are fastened to circuit board 10 to add rigidity to circuit board 10. In a preferred embodiment hardware such as screws 50 are used to secure backing plates 60 and 61 to circuit board 10. However, many fastening devices or methods which are well know in the art could be utilized in assembly of the present invention. In a preferred embodiment, connectors 20A, 21A, 22A and 23A are wave soldered onto circuit board 10 concurrently with other components, thereby reducing production costs.

Figure 2A:
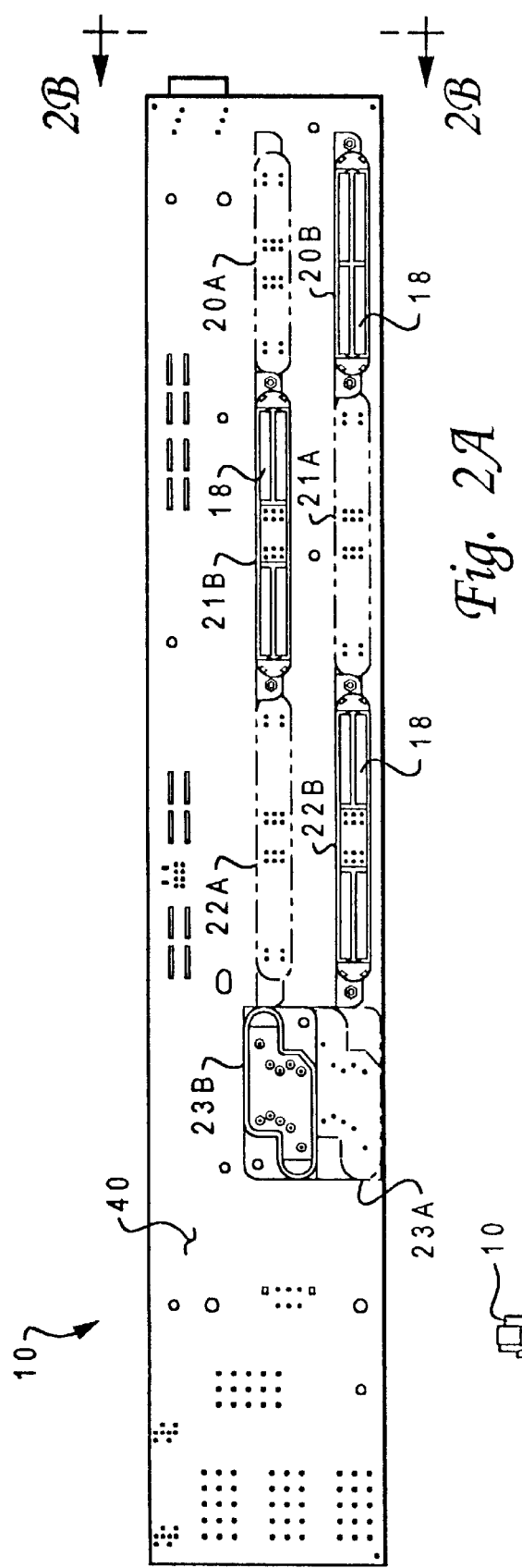
FIG. 2A is a pictorial representation of the second side of a multi-functional power distribution system in accordance with the present invention.

FIG. 2A is a pictorial representation of a second side 40 of circuit board 10 in accordance with one embodiment of the present invention. Connectors 20B, 21B, 22B and 23B are shown secured to second side 40 of circuit board 10. A plurality of contacts 18 are present within each connector 20B, 21B, 22B, 23B, 20A, 21A, 22A and 23A. In the preferred embodiment, connectors 20B, 21B, 22B and 23B utilize a solderless technique to secure contacts 18 to circuit board 10. Contacts 18 can be either pins and sockets. Contacts 18 are well know in the art and will not be discussed in detail.

Power distribution board connectors 20B, 21B, 22B and 23B are located in relation to one another equivalent to the spatial relation of connectors 20A, 21A, 22A and 23A. An equivalent spatial relationship of connectors 20A, 21A, 22A and 23A to connectors 20B, 21B, 22B and 23B allows a substantially identical power supply (not shown in FIG. 2) to be utilized by either side of circuit board 10.

Figure 2B:
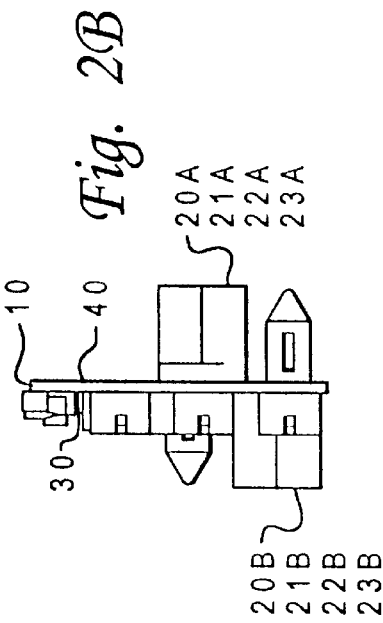
FIG. 2B is a pictorial representation of an end view of a multi-functional power distribution system in accordance with the present invention.

FIG. 2B is a pictorial representation illustrating an end view of circuit board 10 in accordance with one embodiment of the present invention. Connectors 20A, 21A, 22A and 23A are depicted on the front side of circuit board 10 and 20B, 21B, 22B and 23B are depicted on the rear side of circuit board 10. Connectors 20A, 21A, 22A and 23A are separated by circuit board 10 from connectors 20B, 21B, 22B and 23B.

Referring again to FIG. 2A, in a preferred embodiment, connectors 20A, 21A, 22A and 23A (depicted with hidden lines) are offset from 20B, 21B, 22B and 23B such that no connectors are directly opposed. FIG. 2B details how the placement of connectors 20B, 21B, 22B and 23B are a mirror image of the placement of connectors 20A, 21A, 22A and 23A although rotated 180 degrees about the axis of FIG. 1.

A cost effective design, is realized with a high density arrangement of connectors. In reality, density is limited by practical considerations such as component costs, circuit board fabrication costs and circuit board assembly costs. For example, locating connectors in directly opposing locations would require surface mount technology or power supplies with different pin-outs. Surface mount technology requires expensive connectors and fabrication. Also, designs are limited by the availability of surface mount power connectors. Alternatively, a slight offset in through holes for pins of opposing connectors would require a multi-layer board such as a 12 to 14 layer board with heavy circuit traces. Multi layer boards are also considerably more expensive. The present invention maximizes density but is not cost prohibitive.

FIG. 3 illustrates an embodiment of a power distribution system utilizing circuit board 10 and additional substantially identical circuit boards 96 and 98 stacked in a horizontal plane with circuit board 10 (partially obscured by structure 90). Circuit board 10 and substantially identical circuit boards 96 and 98 are assembled within a structure 90.

Figure 4:
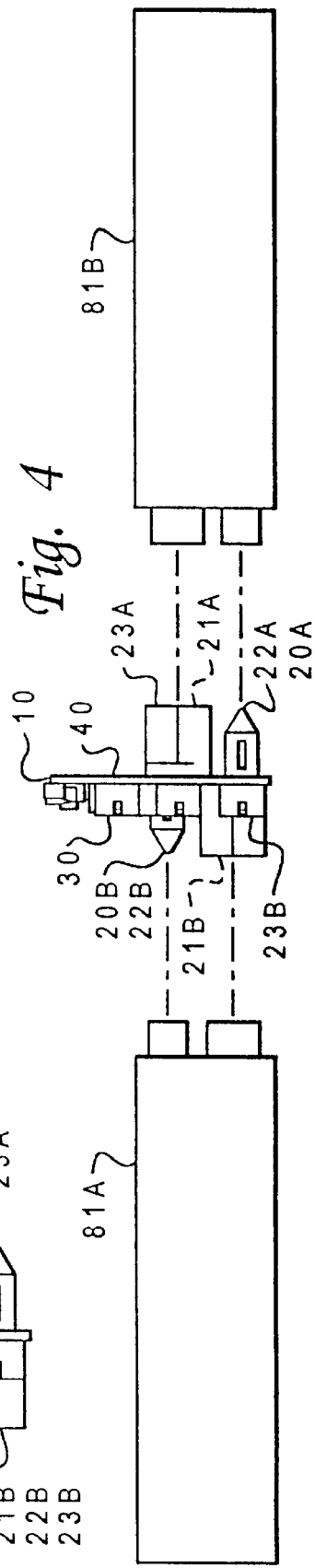
FIG. 4 is a pictorial representation of a cut away section view of a portion of FIG. 3 in accordance with the present invention.

Referring to FIG. 4, view B—B of FIG. 3, connectors 20A, 21A, 22A and 23A of circuit board 10 receive power supply 81A on first side 30 and connectors 20B, 21B, 22B and 23B receive power supply 81B on second side 40. Referring briefly to FIG. 1 an axis of circuit board 10 is shown. In FIG. 4 power supply 81A and power supply 81B are depicted in positions translated 180 degrees about the circuit board axis depicted in FIG. 1. Hence, in accordance with one embodiment, power supply 81A is opposed and inverted in relationship to power supply 81B. This allows minimization of differential power bus lengths while not exceeding circuit board density requirements.

Referring again to FIG. 3, power supplies 81A and 81B are inserted through openings 92 and 94 of structure 90. Structure 90 provides a guide for powers supplies 81A and 81B before connector insertion occurs. Structure 90 mechanically secures multiple power supplies 81A, 82A and 83A in opening 92 of structure 90 and power supplies 81B, 82B and 83B in opening 94 of structure 90.

As shown in FIG. 3 the present invention has great flexibility. Importantly, high density expansion can be realized as the system grows. Additional power supplies can be added to increase the reliability of the power distribution system. Additional power supplies contributing power reduces stress on the power distribution system because the load is distributed, requiring less power from each individual element. Additional power supplies also provide back-up support through redundancy.

In a preferred embodiment power supplies 81A, 82A, 83A, 81B, 82B, and 83B are substantially identical. As depicted in FIG. 4, utilizing opposing slots, each power supply can be plugged into any location allocated for a power supply within structure 90. Therefore, a power supply with the same part number can fit in multiple locations on circuit board 10.

FIG. 4 illustrates, in accordance with another embodiment of the present invention, how opposed power supplies are inverted in relationship to one another. Side A of power supply 81A faces up and the corresponding side A of power supply 81B faces down. The 180° rotation about an axis defined by circuit board 10 allows functionally equivalent connectors to be as close as physically possible, without exceeding pin and trace density on the circuit board 10.

Since no cabling is present, power supply modules can be inserted and removed with ease for testing, maintenance and repair purposes. Easy removal and insertion allows fast troubleshooting and repair of potential power supply problems. A power supply can be relocated from a first side 30 to a second side 40 to isolate abnormalities. In some instances, one power supply may be removed and the results analyzed. In other cases, where one power supply is being utilized an additional power supply can be added to isolate problems. Allowing a plurality of power supplies to be connected to the power distribution board at all locations greatly increases the flexibility of power distribution system. Slide in mounting of power supply modules eliminates cabling requirements and most importantly many other labor intensive requirements.

FIG. 3 also illustrates how a power distribution system can be filled to capacity. When filled to capacity the invention decreases the amount of volume required to provide power to the system. A more significant feature is that the present invention minimizes distribution losses by placing the outputs of the power supplies in close proximity to one another.

While the invention has been particularly shown and described with reference to a preferred embodiment, it will be understood by those skilled in the art that various changes in form and detail may be made therein without departing from the spirit and scope of the invention.

What is claimed is:

1. A power distribution system for use in a computer comprising:
    a circuit card having a front side and a back side;
    said front side having a plurality of contacts disposed to mate with a selected power supply; and
    said back side having a plurality of contacts disposed to mate with said selected power supply, wherein said backside plurality of contacts are rotated such that two of said selected power supplies can be located in close proximity to each other.

2. A power distribution system according to claim 1, wherein said plurality of contacts are mounted in connectors.

3. A power distribution system comprising:
    a power distribution board having a first side opposite a second side, said first side having at least one connector mounted thereon, said second side having at least one connector mounted thereon;
    a first power supply having at least one connector mounted thereon to mate with said connector(s) mounted on said first side of power distribution board; and
    a second power supply having at least one connector mounted thereon to mate with said connector(s) mounted on said second side of power distribution board;
    wherein said first power supply and said second power supply are substantially identical.

4. A power distribution system according to claim 3, wherein said circuit board has an axis, said first power supply and said second power supply occupy positions translated 180 degrees about said circuit board axis.

5. The power distribution system according to claim 3, wherein said second power supply is rotated 180 degrees and is not inverted in relationship to said first power supply.

6. The power distribution system according to claim 3, further comprised of two connectors mounted on said first side of said circuit board and two connectors are mounted on said second side of said circuit board; and
    two connectors are mounted on said first power supply and two connectors are mounted on said second power supply.

7. A power distribution system comprising:
    a power distribution board having a first side opposite a second side, said first side having a first and second connector mounted thereon, said second side having a third and fourth connector mounted thereon;
    a first power supply having first power supply connector disposed to mate with said first power distribution board connector;
    said first power supply having a second power supply board connector disposed to mate with said second distribution board connector;
    a second power supply having a third power supply connector disposed to mate with said third connector of said power distribution board; and
    said second power supply having a fourth power supply connector disposed to mate with said fourth power distribution board connector;
    wherein said first power distribution board connector mounted on said power distribution board is closer to said third power distribution board connector than to both said second power distribution board connector and said fourth power distribution board connector and wherein said first power supply first connector is for supplying a first voltage and said first power supply second connector is for supplying a second voltage and wherein said second power supply third connector supplies said first voltage and said second power supply fourth connector supplies said second voltage.

8. The power distribution system according to claim 7, wherein said first voltage is different than said second voltage.

9. The power distribution system according to claim 7, wherein said second power distribution board connector mounted on said power distribution board is closer to said fourth power distribution board connector than to both said first power distribution board connector and said third power distribution board connector.

* * * * *

UNITED STATES PATENT AND TRADEMARK OFFICE
CERTIFICATE OF CORRECTION

| | |
|---|---|
| PATENT NO. | : 5,808,876 |
| APPLICATION NO. | : 08/880044 |
| DATED | : September 15, 1998 |
| INVENTOR(S) | : Brian Scott Mullenbach et al. |

Page 1 of 1

It is certified that error appears in the above-identified patent and that said Letters Patent is hereby corrected as shown below:

On the title page, item (75) is missing two inventors:

Please add --Gary Allen Thompson, Pine Island, Minn.; Gordon Wilbur Westphal, Rochester, Minn.--

Signed and Sealed this

Sixteenth Day of December, 2008

JON W. DUDAS
*Director of the United States Patent and Trademark Office*